US006543982B1

(12) United States Patent
Nichols et al.

(10) Patent No.: US 6,543,982 B1
(45) Date of Patent: *Apr. 8, 2003

(54) ADJUSTABLE WAFER TRANSFER MACHINE

(75) Inventors: Ernest C. Nichols, Boise, ID (US); Leo L. Malmin, Jr., Nampa, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/977,869

(22) Filed: Nov. 25, 1997

Related U.S. Application Data

(62) Division of application No. 08/649,942, filed on May 14, 1996, now Pat. No. 5,735,662.

(51) Int. Cl.[7] .............................................. H01L 21/00
(52) U.S. Cl. ........................ 414/331.16; 414/416.02; 414/416.09; 414/937; 118/500
(58) Field of Search ........................ 414/404, 937, 414/281, 277, 282, 416.03, 331.16, 416.09, 331.01, 331.14, 416.02; 211/1.57; 118/500; 312/9.1, 9.48, 9.51, 334.4

(56) References Cited

U.S. PATENT DOCUMENTS

| 2,644,588 A | * | 7/1953 | Brown .................. 312/334.4 X |
| 3,119,643 A | * | 1/1964 | Levi et al. ................ 312/334.4 |
| 3,940,174 A | * | 2/1976 | Mayes ................... 211/1.57 X |
| 3,977,566 A | * | 8/1976 | Hill et al. ............... 414/331 X |
| 4,329,928 A | * | 5/1982 | Shaw ..................... 211/1.57 X |
| 4,506,455 A | * | 3/1985 | Rossi ..................... 414/331 X |
| 4,597,819 A | * | 7/1986 | Kusuhara et al. ....... 118/500 X |
| 4,735,470 A | * | 4/1988 | Falk ..................... 312/334.4 X |
| 5,090,863 A | * | 2/1992 | Lichti, Sr. et al. ......... 414/331 |
| 5,211,296 A | * | 5/1993 | D'Heygere ............ 211/1.57 X |
| 5,382,128 A | * | 1/1995 | Tatahashi et al. ....... 414/417 X |
| 5,501,568 A | * | 3/1996 | Ono ..................... 414/938 X |

FOREIGN PATENT DOCUMENTS

| DE | 2101461 | * | 8/1972 | ................ 414/281 |
| DE | 2411415 | * | 9/1975 | ................ 414/281 |
| JP | 48442 | * | 2/1989 | ................ 414/404 |
| JP | 30552 | * | 2/1992 | ................ 414/937 |
| JP | 6-72508 | * | 3/1994 | ................ 414/937 |

* cited by examiner

Primary Examiner—Frank E. Werner
(74) Attorney, Agent, or Firm—Ormiston & McKinney, PLLC

(57) ABSTRACT

An adjustable wafer transfer machine that includes an adjusting mechanism for changing the spacing between adjacent wafers to accommodate placement of the wafers in either a smaller wafer carrier or a larger wafer carrier and a transfer mechanism for transferring the wafers between the smaller wafer carrier and the adjusting mechanism and for transferring the wafers between the larger wafer carrier and the adjusting mechanism. The adjusting mechanism comprises a pair of flat plates disposed parallel to and opposite one another and a plurality of elongated opposing dividers slidably mounted on the plates. The dividers are disposed vertically adjacent to one another at spaced apart intervals and they extend horizontally to support the wafers along a portion of their perimeter. A positioning mechanism is operatively coupled to the dividers for changing the spacing between the dividers and, correspondingly, between the wafers supported on the dividers.

12 Claims, 9 Drawing Sheets

ADJUSTABLE WAFER TRANSFER MACHINE

This application is a division of application Ser. No. 08/649,942, filed May 14, 1996, now U.S. Pat. No. 5,735,662.

FIELD OF THE INVENTION

The invention relates generally to semiconductor manufacturing equipment and, more particularly, to wafer transfer machines.

BACKGROUND OF THE INVENTION

Generally, semiconductor devices are mass produced by forming many identical circuit patterns on a single silicon wafer which is thereafter cut into many identical dies or "chips." Semiconductor devices, also commonly referred to as integrated circuits, are typically constructed by successively depositing or "stacking" layers of various materials on the wafer. Each layer is patterned as necessary to form the desired circuit components. To ensure reliable and predictable operation of integrated circuits, the wafer and deposited materials must be free from contamination. Hence, many fabrication processes must be performed in an environment that is essentially free from contamination. For example, the contamination level requirement for Class 1 cleanliness in semiconductor wafer processing areas or "clean rooms" is less than one part (contaminates) per cubic foot. To achieve this high degree of cleanliness, special high volume ventilation systems are used to continuously filter the air. These systems represent a significant contribution to the overall cost of manufacturing semiconductor devices. Accordingly, substantial cost savings can be realized by minimizing the size of the clean rooms and by making the most efficient use of all available clean room space.

A number of different size wafers, ranging from 3 inches in diameter to 8 inches in diameter, are currently produced in the semiconductor industry. In addition, development efforts are underway to produce 10 and 12 inch diameter wafers. While it is economically desirable to have the capability to produce wafers of all sizes, each size wafer generally requires its own special processing equipment. The redundancy in equipment to process different size wafers increases equipment costs as well as the size of the clean room and the associated construction and maintenance costs. Cost and space savings could be realized if some of the same equipment could be used to process different size wafers.

During the manufacture of semiconductor devices, the wafers are subjected to a number of different processes and environmental conditions. Wafer carriers, sometimes also called cassettes or "boats," are used to house the wafers for processing, bulk storing and transporting through the manufacturing processes. One type of wafer carrier is not typically suitable for exposure to all of the different environmental conditions encountered during processing. As a result, the wafers have to be transferred between different types of boats at various times during the production of the semiconductor devices. Wafer transfer machines are used to perform this task. Conventional wafer transfer machines are capable of transferring only one size wafer to and from only one size wafer carrier. It would be advantageous in reducing manufacturing costs to process smaller diameter wafers in larger diameter wafer processing machines. For example, it is desirable to process six inch wafers using eight inch processing machines. Thus, there is a need for a wafer transfer machine that is capable of transferring six inch diameter wafers to and from eight inch diameter wafer carriers to facilitate processing the six inch wafers in eight inch machines. One problem associated with such a transfer, however, is the disparate wafer to wafer spacing in six inch and eight inch wafer carriers. That is, the wafer to wafer spacing is 3/16 inch in six inch wafer carriers and ¼ inch in eight inch wafer carriers. What is needed is a wafer transfer machine that can adjust the wafer to wafer spacing to accommodate the use of both six inch and eight inch wafer carriers.

SUMMARY OF THE INVENTION

Accordingly, it is one object of the invention to facilitate the utilization of eight inch wafer processing machines to process six inch wafers. It is another object to reduce the number of machines necessary to support the processing of different size wafers, particularly in a clean room environment. It is a further object of the invention to reduce the equipment and associated clean room costs for the manufacture of semiconductor devices. It is yet another object of the invention to transfer smaller diameter wafers, typically six inch wafers, to and from a larger diameter wafer carrier, typically an eight inch wafer carrier.

These and other objects and advantages may be achieved by a novel apparatus for adjusting the spacing between a series of semiconductor wafers or other such planar objects aligned parallel to one another. The apparatus includes a pair of flat plates disposed parallel to and opposite one another. The plates are spaced apart a distance sufficient to allow the horizontal passage of the objects therebetween. A plurality of elongated opposing dividers are slidably mounted on the plates. The dividers are disposed vertically adjacent to one another at spaced apart intervals and they extend horizontally to support the objects along a portion of their perimeter. A positioning mechanism is operatively coupled to the dividers for changing the spacing between the dividers. The positioning mechanism is operative between a first position wherein the dividers are vertically spaced apart a first distance and a second position wherein the dividers are vertically spaced apart a second distance greater than the first distance. Thus, the spacing between the objects may be changed by moving the positioning mechanism alternately between the first and second positions.

In one preferred version of this spacing adapter apparatus, the positioning mechanism comprises a series of vertically oriented slots in the plates. Each divider is slidably mounted in a respective one of the slots. The first slot has a length $L_1$ and each succeeding slot has a length $L_n$ computed according to the equation $L_n = L_{n-1} + \Delta D$, where $L_{n-1}$ is the length of the immediately preceding slot and $\Delta D$ is the difference between the first distance and the second distance. The spacing between the objects is changed in this version of the invention by moving the dividers up and down in the slots.

Another aspect of the invention provides an adjustable wafer transfer machine that allows wafers to be transferred between smaller and larger wafer carriers. The adjustable wafer transfer machine of the present invention includes (1) an adjusting mechanism for changing the spacing between adjacent wafers to accommodate placement of the wafers in either a smaller wafer carrier or a larger wafer carrier, and (2) a transfer mechanism for transferring the wafers between the smaller wafer carrier and the adjusting mechanism and for transferring the wafers between the larger wafer carrier and the adjusting mechanism. In one preferred version of this aspect of the invention, the adjusting mechanism constitutes the spacing adapter apparatus described above. In another preferred version of this aspect of the invention, the transfer mechanism includes a turntable assembly and two transfer arms. The turntable assembly consists of a turntable rotatably mounted on a base. The turntable has a first portion and a second portion. The first portion has an upper surface for receiving the wafer carriers. The adjusting mechanism, such as the preferred spacing adapter, is operatively coupled to the second portion of the turntable. The first transfer arm is positioned adjacent to one end of the turntable and the second transfer arm is positioned adjacent to the other end of the turntable. The turntable is operable to rotate between a first position and a second position. When the turntable is in the first position, the first portion of the turntable (which receives the wafer carriers) is adjacent to the first transfer arm and the second portion of the turntable (on which the adjusting mechanism is mounted) is positioned adjacent to the second transfer arm. When the turntable is in the second position, the first portion of the turntable is adjacent to the second transfer arm and the second portion of the turntable is adjacent to the first transfer arm.

BRIEF DESCRIPTION OF THE DRAWINGS

FIG. 6A is a detail isometric view of a portion the wafer dividers disposed along the inner surface of the spacing adapter shown in FIG. 6.

FIG. 8 shows the machine configured to transfer the wafers from a smaller wafer carrier into the spacing adapter and from the spacing adapter into a larger wafer carrier. FIG. 9 shows the machine configured to transfer the wafers from a larger wafer carrier into the spacing adapter and from the spacing adapter into a smaller wafer carrier.

DETAILED DESCRIPTION OF THE INVENTION

Figure 1:
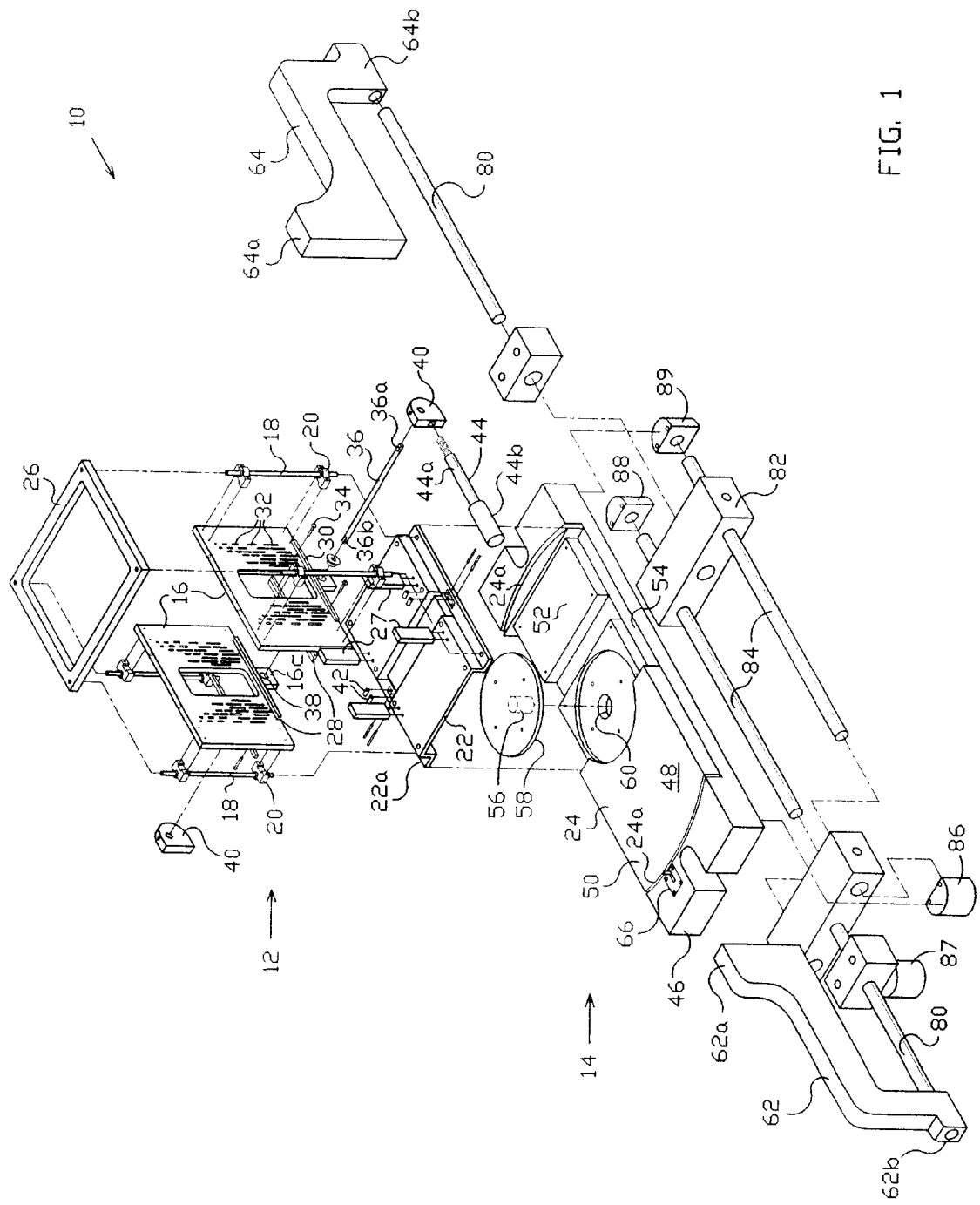
FIG. 1 is an exploded isometric view of the presently preferred embodiment of the adjustable wafer transfer machine.
Figure 3:
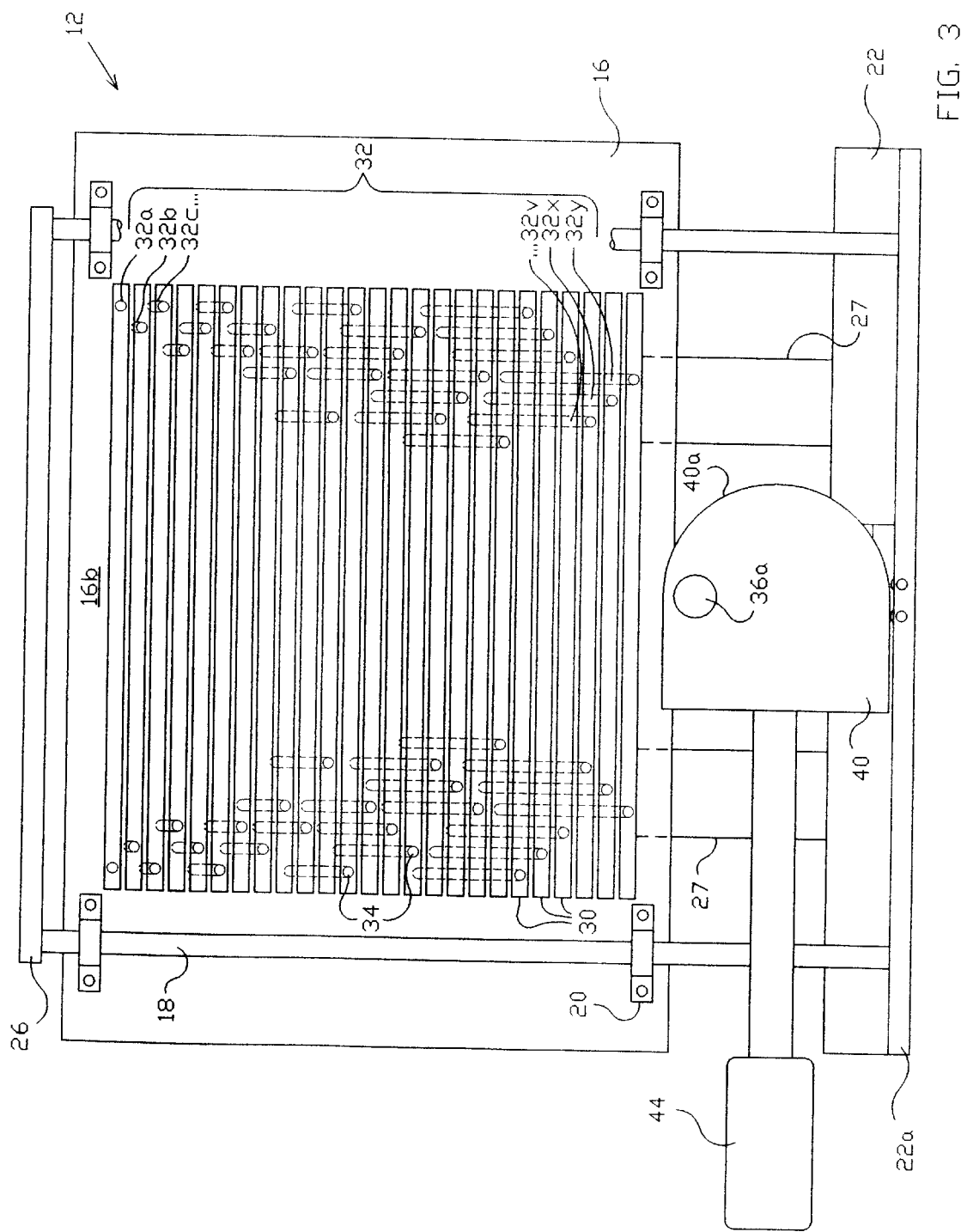
FIG. 3 is an elevation view of the spacing adapter of the adjustable wafer transfer machine of FIG. 1 configured to increase the spacing between wafers for transferring the wafers into a larger wafer carrier.
Figures 4, 4A:
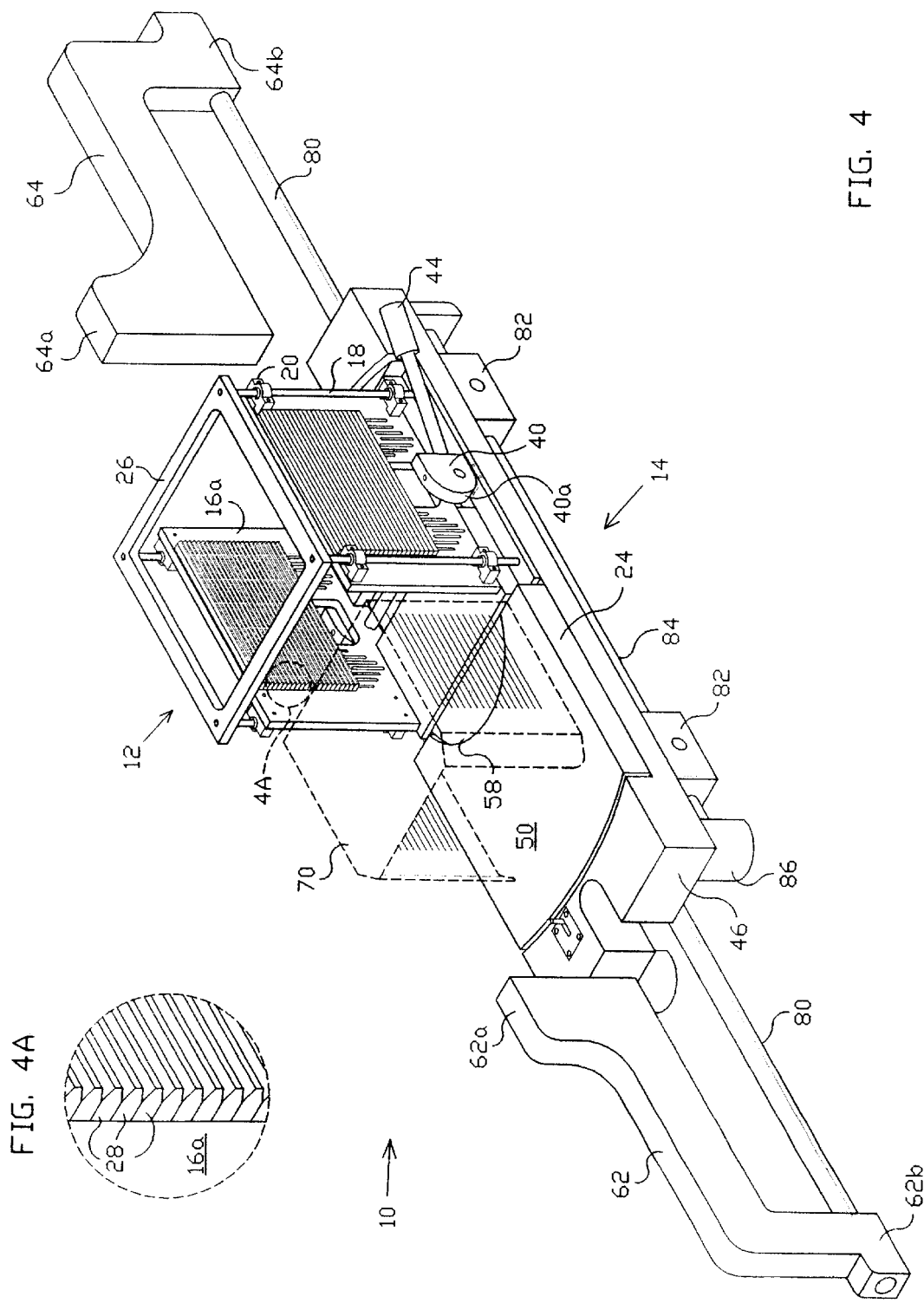
FIG. 4 is an isometric view of the adjustable wafer transfer machine of FIG. 1 with a smaller wafer carrier installed on the turntable for transferring the wafers from the smaller wafer carrier into the spacing adapter.
FIG. 4A is a detail isometric view of a portion the wafer dividers disposed along the inner surface of the spacing adapter shown in FIG. 4.
Figure 5:
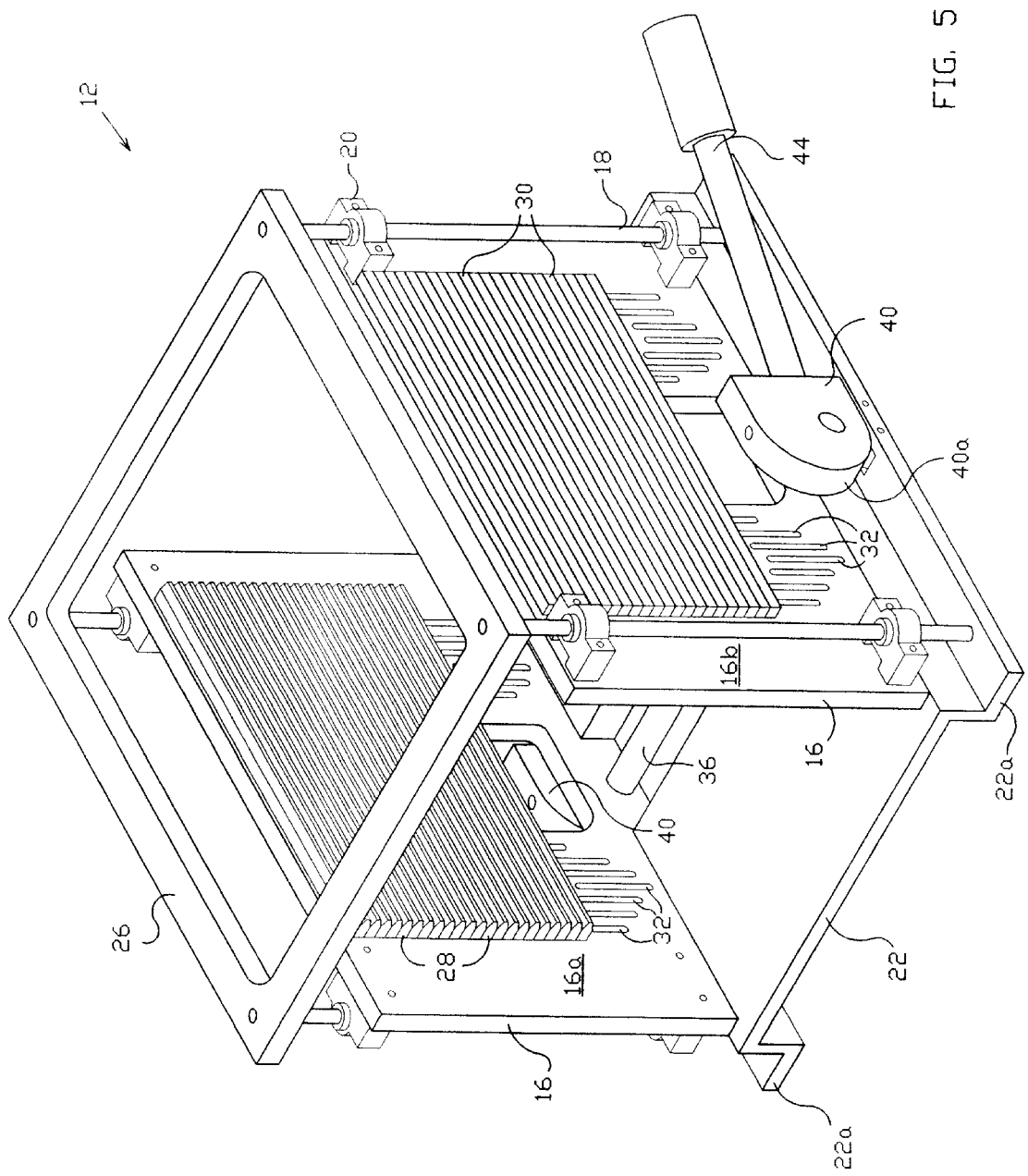
FIG. 5 is a detail isometric view of the spacing adapter configured to receive wafers from or transfer wafers to a smaller wafer carrier.

Referring to FIGS. 1 and 4, adjustable wafer transfer machine 10 includes a spacing adapter 12 mounted on a turntable assembly 14. Turntable assembly 14 consists of a turntable 24 mounted on a base 46. The component parts of spacing adapter 12 will now be described with reference to FIGS. 1–5. A pair of guide plates 16 are positioned opposite one another on each side of turntable assembly 14. Guide plates 16 are constructed as flat rectangular plates having an inner surface 16a, an outer surface 16b, and a flange like projection 16c. Guide plates 16 are attached to guide rods 18 through pillow blocks 20. Preferably, the bore of each pillow block 20 is fitted with a bushing, linear bearing or the like to better allow guide plates 16 to slide up and down on guide rods 18. Also preferably, there are four pillow blocks 20 attached to guide plates 16 at or near the corners of guide plates 16. Saddle member 22 is mounted on turntable 24. The lower ends 18a of guide rods 18 are attached to saddle member 22. Alternatively, to achieve more stability lower ends 18a of guide rods 18 may be extended through saddle member 22 and threaded into turntable 24. The upper ends 18b of guide rods are fastened to top frame member 26. Thus, guide rods 18 are fixed in a vertical orientation. As will be apparent to those skilled in the art, various other means and configurations for mounting guide rods 18 are possible. All that is required is that guide rods 18 be made sufficiently rigid to maintain a substantially vertical orientation under load during wafer transfer operations.

A series of wafer dividers 28 extend along and project inwardly from the inner surfaces 16a of guide plates 16. Dividers 28 support the wafers along a portion of the perimeter of each wafer in essentially the same way the wafers are held in a conventional wafer carrier. To better illustrate the various features of the invention, only one divider is shown in FIG. 1. A typical wafer carrier holds up to twenty five wafers. Hence, twenty five dividers 28 would ordinarily be used. Dividers 28 are constructed as elongated bars having wedge shaped projections in opposing alignment with one another. Each divider 28 has a corresponding optional counterweight 30. Counterweights 30 are positioned on the outer surfaces 16b of guide plates 16 opposite the corresponding divider. Dividers 28 are mounted through vertical slots 32 in guide plates 16 to counterweights 30 by pins 34. Thus, pins 34 extend through slots 32 between dividers 28 and counterweights 30. Pins 34 may be any suitable fastener, such as a shoulder bolt, that will slide in slots 32 after dividers 28 are mounted to counterweights 30. Each counterweight 30 weighs approximately the same as each divider 28 so that pins 34 slide up and down in slots 32 without binding. Preferably, counterweights 30 are constructed as elongated bars. In this way, dividers 28 are made to move smoothly and evenly up and down as guide plates 16 are raised and lowered.

Figure 2:
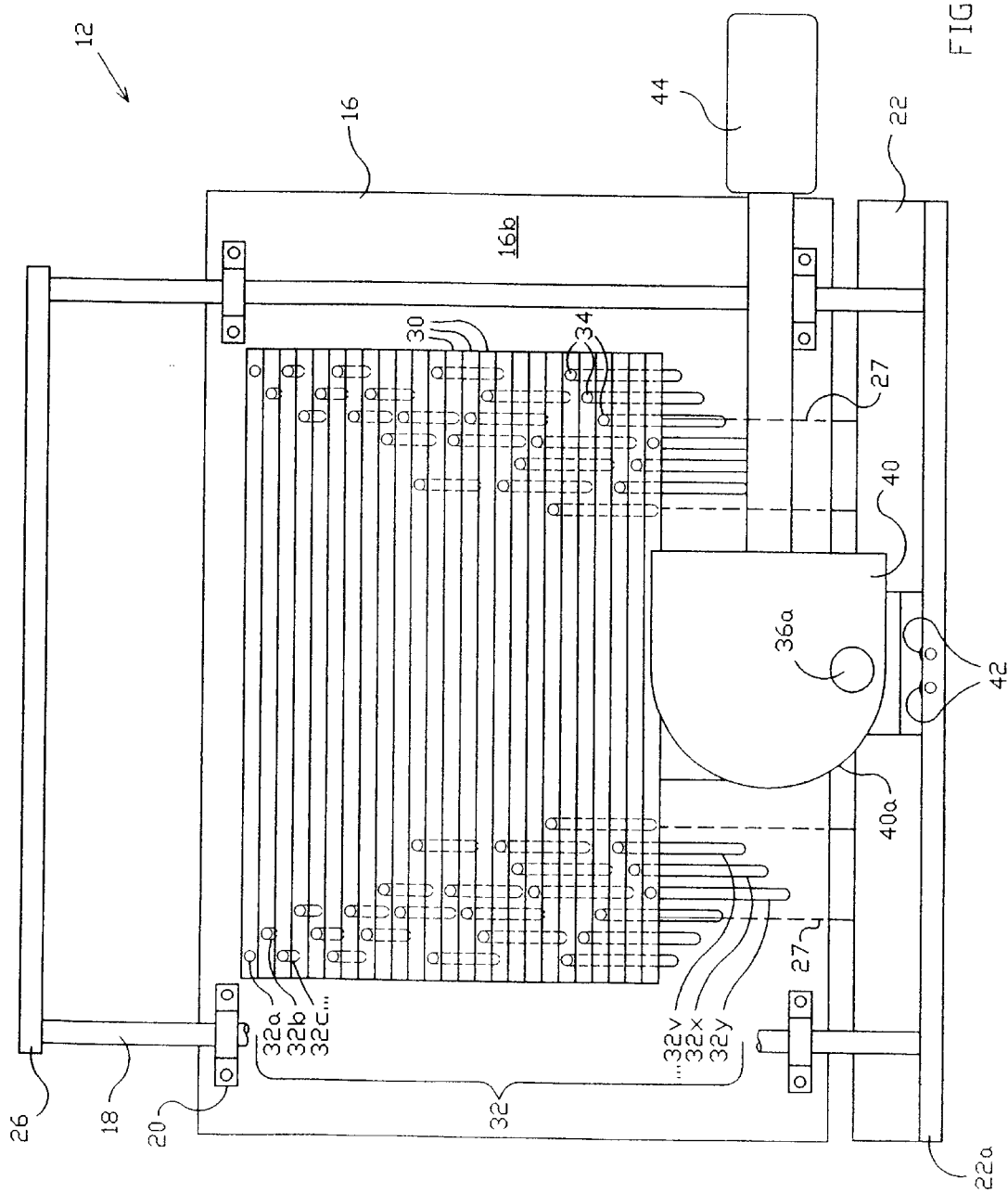
FIG. 2 is an elevation view of the spacing adapter of the adjustable wafer transfer machine of FIG. 1 configured to receive wafers from a smaller wafer carrier.

Lift rod 36 extends through holes 38 in projection 16c of guide plates 16 between lift cams 40. Preferably, holes 38 are fitted with a bushing, bearing or the like to better allow lift rod 36 to turn in holes 38. Each lift cam 40 has a circumferential contact perimeter 40a that rotates on a pair of rollers 42 mounted in the flange portion 22a of saddle member 22, as best seen in FIGS. 2 and 3. Alternatively, contact perimeter 40a may rotate directly on flange portion 22a. Rollers 42 are preferred to allow lift cams 40 to rotate easily and to minimize wear on the contact surfaces and thereby reduce the risk of particulate contamination of the semiconductor wafers. The ends 36a and 36b of lift rod 36 are attached to lift cams 40 at a point off center to provide for a camming action as the lift cams 40 are rotated. Thus, guide plates 16 can be raised and lowered by rotating lift cams 40. Other configurations or mechanism to raise and lower guide plates 16 are possible. For example, lift cams 40 may be constructed to have an oblong perimeter (i.e., a lobe), in which case lift rod 36 attaches to the center of lift cams 40, to achieve the necessary camming action as the lift cams are rotated. The camming mechanism described could be omitted and the guide plates 16 raised and lowered simply by lifting and releasing lift rod 36. Alternatively, the dividers/counterweights could be raised and lowered. Lift cams 40 are sized and shaped as necessary to cause guide plates 16 to move vertically at least the distance equal to the length of the longest of the vertical slots 32. The camming action to raise and lower guide plates 16 is initiated by rotating handle 44, which is attached to one of the lift cams. Preferably, handle 44 includes a lever portion 44a and a knob portion 44b. Also preferably, lift rod 36 is keyed to lift cams 40 so that both cams rotate upon rotation of handle 44.

Turntable assembly 14 includes a base 46 and a turntable 24. Turntable 24 of turntable assembly 14 is, preferably, shaped like a segmented disc having circular outer perimeter ends 24a. Turntable 24 includes an upper surface 48. Upper surface 48 is divided into a first portion 50, upon which wafer carriers are placed during transfer operations, and a second portion 52 upon which saddle member 22 is mounted. Turntable 24 is pivotally mounted in base 46. Preferably, base 46 is recessed so that the upper surface of base 46 is flush with the first portion 50 of upper surface 48 of turntable 24. Base 46 also preferably includes circular recessed sidewalls 54 that correspond to the circular outer perimeter ends 24a of turntable 24. Turntable 24 pivots about bearing rod 56 with respect to base 46. Bearing rod 56 is fixedly attached to turntable 24 through bearing rod plate 58. Bearing rod 56 extends through a hole 60 in base 46 so that turntable 24 can pivot with respect to base 46 by means of bearing rod 56 rotating in hole 60. Preferably, hole 60 is lined with a bushing or bearing to facilitate the rotation of bearing rod 56 in hole 60. Also preferably, a bearing is used at the interface of turntable 24 and base 46 to allow turntable 24 to slide easily over base 46.

In operation, a first wafer carrier 70 containing smaller diameter wafers (not shown), typically six inch wafers, is positioned on first portion 50 of upper surface 48. Wafers are transferred from first carrier 70 to spacing adapter 12 via a first transfer arm 62. In a standard six inch wafer carrier, the wafers are spaced apart 3/16 inch. That is, the wafer to wafer gap is 3/16 inch. Thus, guide plates 16 are in the lowered position, so that dividers 28 are positioned at the top of slots 32, for receiving the wafers from the first smaller diameter wafer carrier 70. The lower-most dividers are blocked by pads 27 to force dividers 28 to the top of slots 32 when guide plates 16 are in the lowered position. Pads 27 are mounted on saddle member 22 under dividers 28. Pads 27 are sized as necessary to locate the lower-most divider at the top of the corresponding slot. The remaining dividers are successively stacked one upon the other when guide plates 16 are in the lowered position. Alternatively, pads 27 may be located under counterweights 30 to achieve the same blocking and stacking effect of dividers 28.

Once the wafers have been transferred into the spacing adapter 12, they are repositioned by raising guide plates 16. Guide plates 16 are raised by rotating handle 44, as best seen by comparing FIGS. 2 and 3. As handle 44 is rotated, lift rod 36 raises guide plates 16 under the camming action of lift cams 40 turning on rollers 42. As guide plates 16 are raised, dividers 28 and counterweights 30 fall to the bottom of slots 32. Thus, the spacing between wafers is increased as required to accommodate transfer of the smaller diameter wafers into a second wafer carrier for larger diameter wafers, typically eight inch wafers. In a standard eight inch wafer carrier, the wafers are spaced apart 1/4 inch. That is, the spacing between wafers is 1/4 inch.

The pattern of slots 32 required to reposition twenty five wafers from a wafer to wafer gap of 3/16 inch to a wafer to wafer gap of 1/4 inch (and from 1/4 to 3/16 inch) is illustrated in FIGS. 2 and 3. Slots 32a–32y are disposed in a staggered configuration so that the distance between the top of each slot and the immediately preceding slot is 3/16 inch. Slot 32a, corresponding to the top wafer in a fully loaded wafer carrier, has a length of zero. Thus, the divider held in slot 32a moves the full range of guide plates 16 as they are raised and lowered. Each succeeding slot 32b–32y is 1/16 inches longer than the preceding slot. Slot 32y, corresponding to the bottom wafer in a fully loaded wafer carrier, is 1½ inches long. Thus, the divider held in slot 32y remains essentially stationary as guide plates 16 are raised and lowered. In general, the first/top slot has a length $L_1$ and each succeeding slot has a length $L_n$ computed according to the equation $L_n = L_{n-1} + \Delta D$, where $L_{n-1}$ is the length of the immediately preceding slot and $\Delta D$ is the change in wafer to wafer gap spacing between the smaller and larger wafer carriers.

Figure 6:
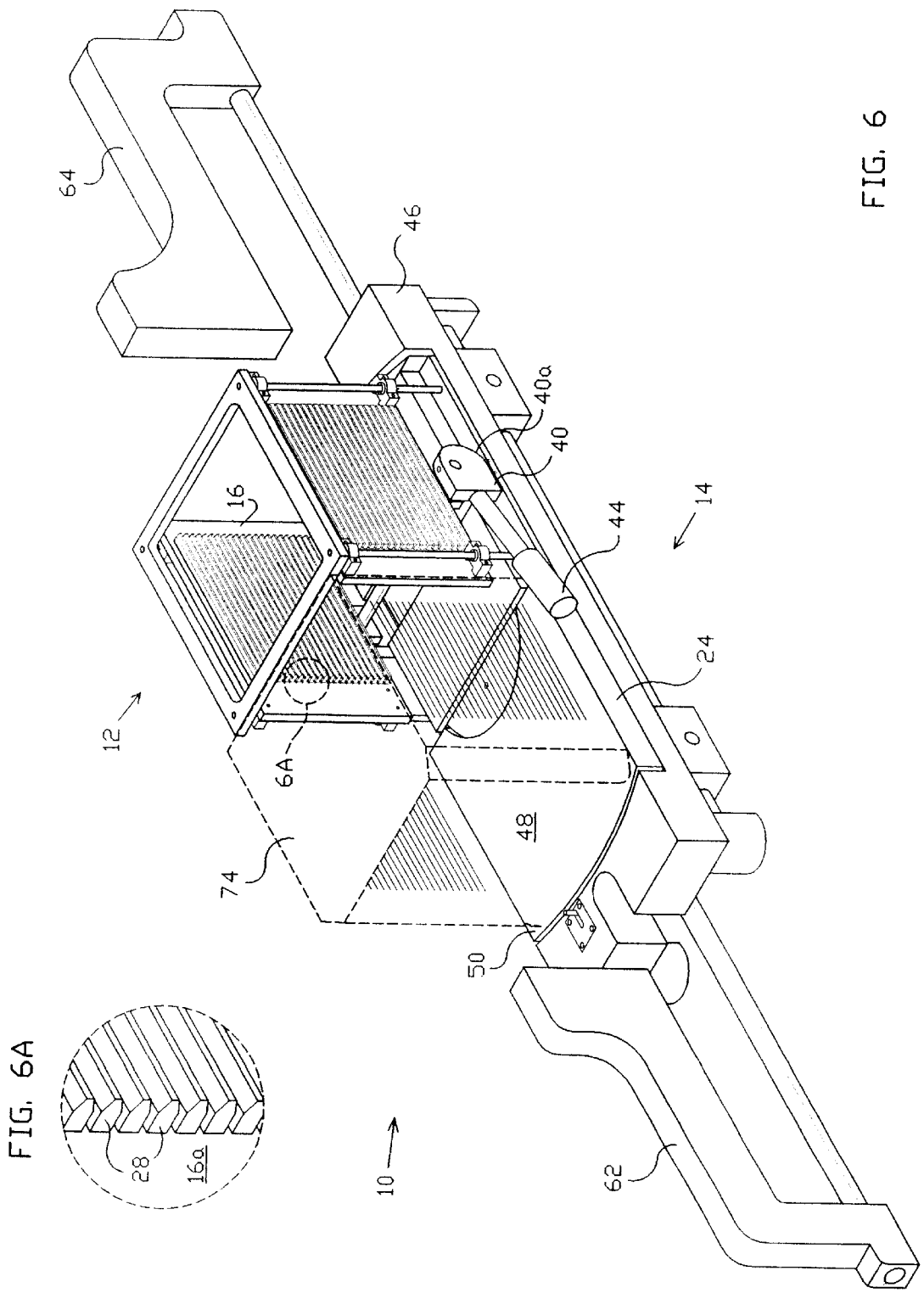
FIG. 6 is an isometric view of the adjustable wafer transfer machine of FIG. 1 with a larger wafer carrier installed on the turntable for transferring the wafers from the spacing adapter into the larger wafer carrier.

Referring to FIG. 6, once the wafers have been repositioned to achieve the desired wafer to wafer gap spacing, the wafers are transferred from spacing adapter 12 to second wafer carrier 74 via second transfer arm 64.

Figure 7:
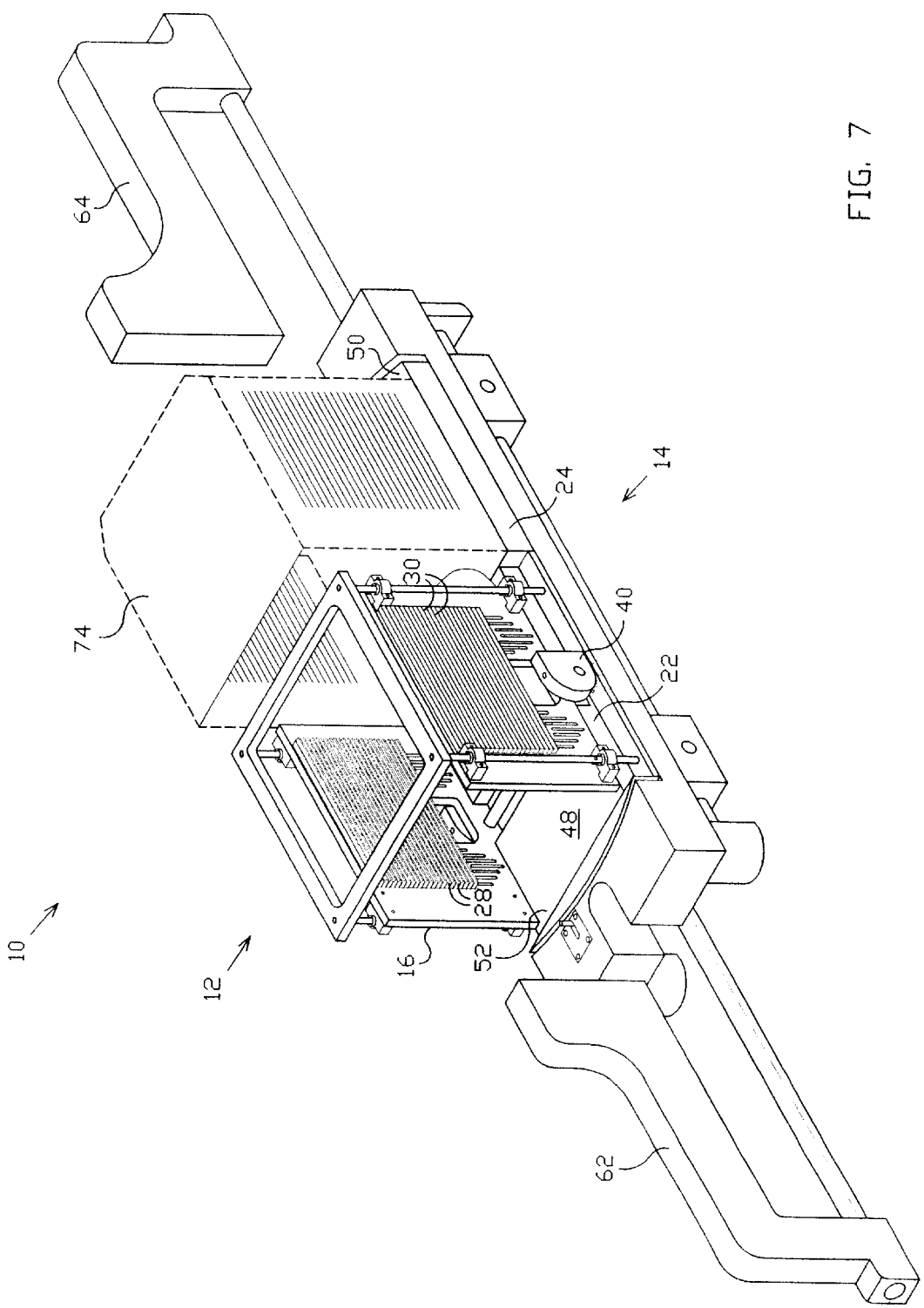
FIG. 7 is an isometric view of the adjustable wafer transfer machine of FIG. 1 with a larger wafer carrier installed on the turntable for transferring the wafers from the larger wafer carrier into the spacing adapter.

Turntable assembly 14 is used to reverse the process to transfer wafers from second wafer carrier 74 to the smaller diameter first wafer carrier 70. Referring to FIG. 7, turntable 24 is rotated 180° so that first portion 50 of upper surface 48 is adjacent to second transfer arm 62. Second wafer carrier 74 is positioned on first portion 50 of upper surface 48 of turntable 24. The wafers are transferred from second carrier 74 to spacing adapter 12 via second transfer arm 64. Once the wafers have been transferred into the spacing adapter 12, second carrier 74 is removed and the wafers are repositioned by lowering guide plates 16. Guide plates 16 are lowered by rotating handle 44, as best seen by comparing FIGS. 3 and 2. As handle 44 is rotated, lift rod 36 lowers guide plates 16 under the camming action of lift cams 40 turning on rollers 42. As guide plates 16 are lowered, the lower-most dividers are blocked by pads 27 to force dividers 28 and counterweights 30 to the top of slots 32. Thus, the wafer to wafer gap is decreased as required to accommodate the transfer of the wafers into the smaller diameter first wafer carrier 70. Once the wafers have been repositioned to achieve the desired wafer to wafer gap spacing, the wafers are transferred from spacing adapter 12 to first wafer carrier 70 via first transfer arm 62.

Referring again to FIGS. 1 and 4, transfer arms 62 and 64 each have a transfer end 62a, 64a and a translation end 62b, 64b. The translation of transfer arms 62, 64 is by means of slide rods 80. One end of slide rods 80 is attached to the translation ends 62b, 64b of transfer arms 62, 64. The other end of slide rods 80 is attached to slide blocks 82. Slide blocks 82 are mounted on and slide along slide rails 84. Slide rails 84 are mounted parallel to the longitudinal axis of turntable assembly 14 between two pairs of legs 86, 87 and 88, 89. Legs 86–89 are mounted to the bottom of base 46. Preferably, legs 86–89 are positioned on base 46 to block the movement of slide blocks 82 and thereby limit the range of motion of transfer arms 62, 64.

As will be apparent to those skilled in the art, the inside dimensions of a standard eight inch wafer carrier should modified to conform to the size of a six inch wafer to allow the carrier to receive and hold six inch wafers.

Figure 8:
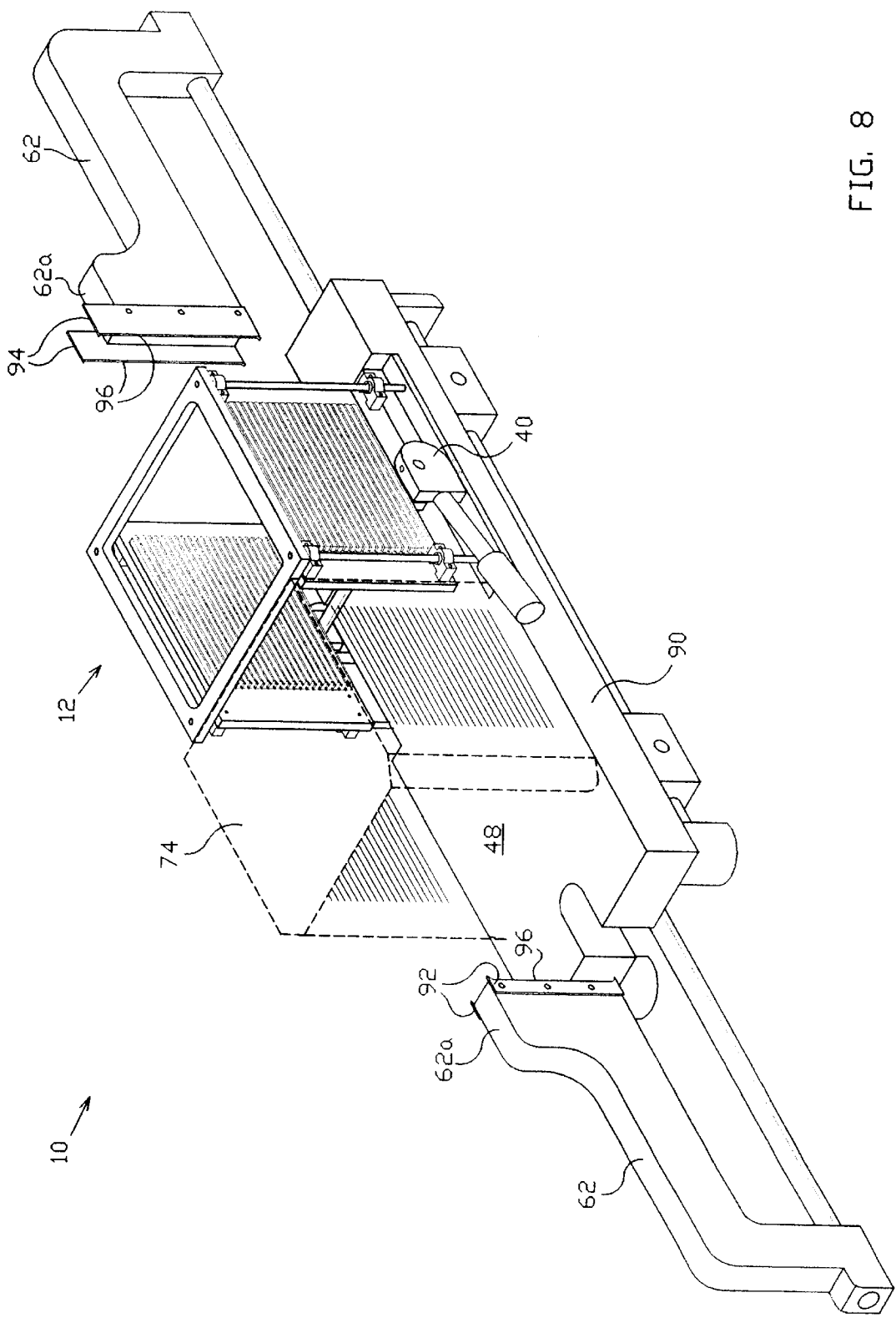
FIGS. 8 and 9 are isometric views of an alternative embodiment of the wafer transfer machine wherein the spacing adapter is mounted on a fixed base plate. Transfer plates removably attached to the transfer arms are provided to accommodate the different size wafer carriers.
Figure 9:
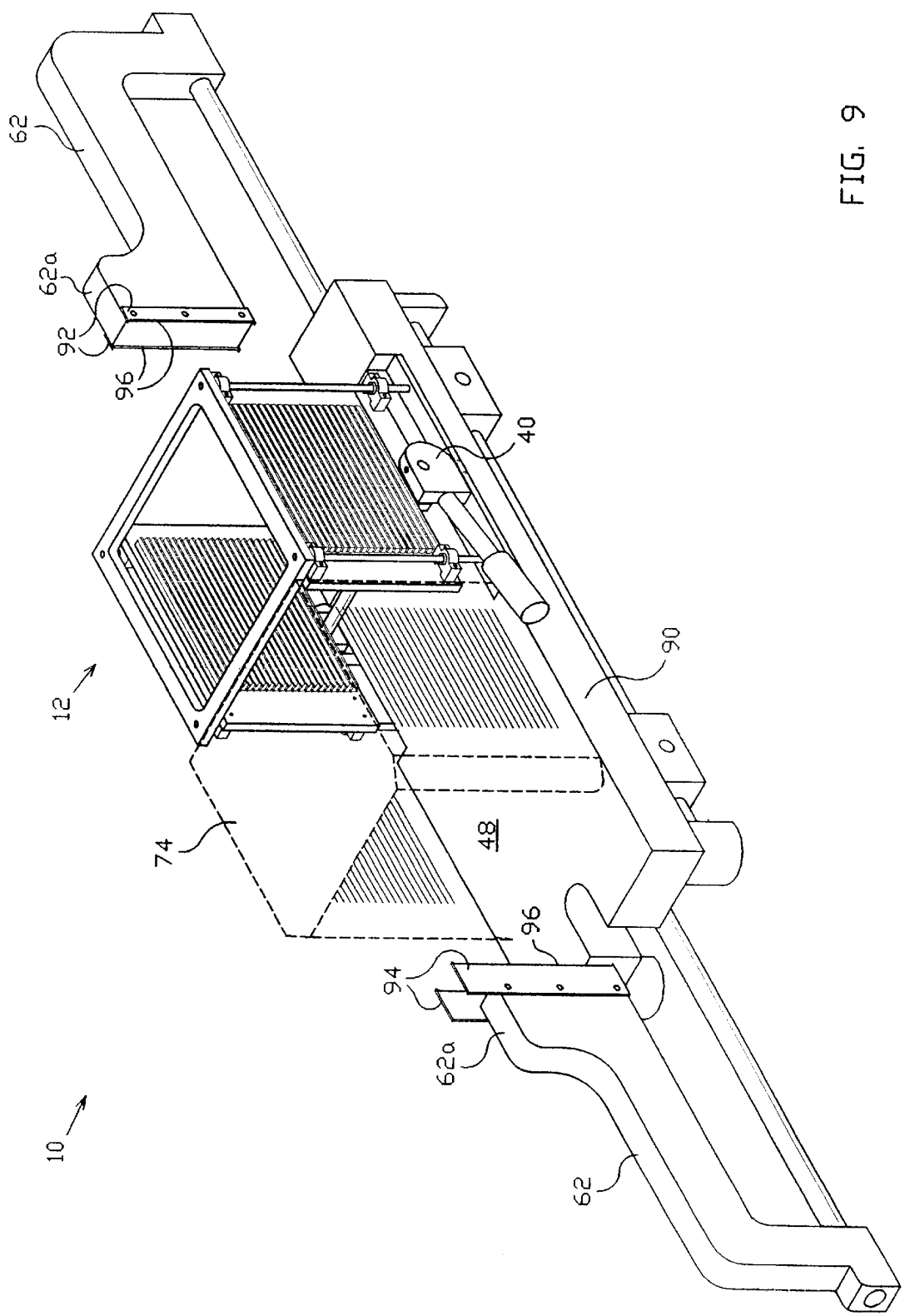

In an alternative embodiment illustrated in FIGS. 8 and 9, spacing adapter 12 is mounted on a stationary base plate 90, rather than on the turntable assembly of the previously described embodiment. Transfer plates 92, 94 are provided to accommodate different size wafer carriers. Transfer plates 92, 94 are removably attached to transfer ends 62a, 64a of transfer arms 62, 64 to change the overall length of wafer contact surface 96 appropriate for a particular size wafer carrier. As shown in FIG. 8, transfer plate 92 is installed on first transfer arm 62 to transfer wafers from a smaller diameter wafer carrier into spacing adapter 12. Transfer plate 94, which is taller and wider than transfer plate 92, is installed on second transfer arm 64 to transfer the wafers from spacing adapter 12 into a larger diameter wafer carrier. To reverse the process, transfer plates 94 are installed on first transfer arm 62 to transfer the wafers from a larger diameter wafer carrier into spacing adapter 12. Transfer plates 92 are installed on second transfer arm 64 to transfer the wafers from spacing adapter 12 into a smaller diameter wafer carrier.

Wafer transfer machine 10 also preferably includes a lock 66 that prevents any unintended rotation of turntable 24. Lock 66 represents generally any suitable locking mechanism such as a spring loaded retractable piece that extends into a corresponding recess in one or both ends 24a of turntable 24.

Conventional bearings may be used for all moving parts to minimize surface wear. For example, pillow blocks 20 are linear pillow block bearing assembly, such as a Berg model LPA-1. The lift bearings that support lift rods 36 are single row flanged ball bearings, such as a Berg model B2-22-S-Q3. The bearing rod bearing, which is seated in hole 60, is a single row, unshielded, unflanged ball bearing, such as a Berg model B10-4. Preferably, the bearing rod bearing is used together with a thrust bearing, such as a Berg model B5-8-SS, located under bearing rod plate 58. Other conventional bearings may be substituted for those mentioned. The structural components of the adjustable wafer transfer machine may be made of any suitable structurally stable corrosion resistant material, such as polypropylene, aluminum or stainless steel. Bearing surface materials are preferably made of stainless steel to minimize the risk of contaminating the wafers and to reduce wear on the contact surfaces.

While there is shown and described the preferred embodiment of the invention, it is to be understood that this invention is not limited thereto but may be variously embodied to practice within the scope of the following claims.

What is claimed is:

1. An apparatus for adjusting the spacing between planar objects disposed parallel to one another, the apparatus comprising:

a pair of flat plates mounted to a base disposed parallel to, opposite and facing one another, the plates being spaced apart a distance sufficient to allow the horizontal passage of the objects therebetween and each plate having a series of vertically oriented slots therein; and a plurality of elongated opposing dividers slidably mounted in respective ones of the slots in the plates, the dividers being disposed vertically adjacent to one another at spaced apart intervals and extending horizontally for supporting the objects along a portion of their perimeter, and the dividers slidable in the slots between a first position wherein the dividers are vertically spaced apart a first distance and a second position wherein the dividers are vertically spaced apart a second distance greater than the first distance.

2. An apparatus according to claim 1, wherein the first slot has a length $L_1$ and each succeeding slot has a length $L_n$ computed according to the equation $L_n=L_{n-1}+\Delta D$ where $L_{n-1}$ is the length of the immediately preceding slot and $\Delta D$ is the difference between the first distance and the second distance.

3. An apparatus according to claim 2, wherein the dividers are positioned at the bottom of their respective slots when in the second position.

4. An apparatus according to claim 2, wherein the slots are disposed in a staggered configuration so that the distance between the top of each slot and the immediately preceding slot corresponds to the first distance.

5. An apparatus according to claim 4, wherein the dividers are positioned at the top of their respective slots when in the first position.

6. An apparatus according to claim 1, wherein the plates are movably mounted to the base and further comprising a rotatable cam operatively coupled between the plates and the base, the cam configured to lift the plates from a first lowered position in which the dividers are spaced apart the first distance and a second raised position in which the dividers are spaced apart the second distance.

7. An apparatus according to claim 1, wherein the plates are movably mounted to the base and further comprising a rod connected to and extending between the plates and a rotatable cam connected between the base and the rod, the cam configured to lift the rod and, correspondingly the plates, from a first lowered position in which the dividers are spaced apart the first distance and a second raised position in which the dividers are spaced apart the second distance.

8. An apparatus for adjusting the spacing between planar objects disposed parallel to one another, the apparatus comprising:

a pair of flat plates mounted to a base disposed parallel to, opposite and facing one another, the plates being spaced apart a distance sufficient to allow the horizontal passage of the objects therebetween and each plate having a series of vertically oriented slots therein arranged next to each other across a portion of the plate;

a plurality of elongated opposing dividers slidably mounted in respective ones of the slots in the plates, the dividers being disposed vertically adjacent to one another at spaced apart intervals and extending horizontally for supporting the objects along a portion of their perimeter; and a sliding means operatively coupled to the dividers for sliding the dividers in the slots between a first position wherein the dividers are vertically spaced apart a first distance and a second position wherein the dividers are vertically spaced apart a second distance greater than the first distance.

9. An apparatus according to claim 8, wherein the plates are movably mounted to the base and the sliding means comprises a lift rod connected to and extending between the plates, the lift rod movable between a first lowered position in which the plates are lowered and the dividers are spaced apart the first distance and a second raised position in which the plates are raised and the dividers are spaced apart the second distance.

10. An apparatus according to claim 8, wherein the plates are movably mounted to the base and the sliding means comprises a rotatable cam operatively coupled between the plates and the base and a means operatively coupled to the cam for rotating the cam, the cam configured upon rotation to lift the plates from a first lowered position in which the dividers are spaced apart the first distance and a second raised position in which the dividers are spaced apart the second distance.

11. An apparatus according to claim 10, wherein the means for rotating the cam comprises a handle connected to and extending away from the cam and a person pulling the handle.

12. An apparatus according to claim 8, wherein the plates are movably mounted to the base and the sliding means comprises a rod connected to and extending between the plates, a rotatable cam connected between the base and the rod, and a means operatively coupled to the cam for rotating the cam, the cam configured upon rotation to lift the rod and, correspondingly the plates, from a first lowered position in which the dividers are spaced apart the first distance and a second raised position in which the dividers are spaced apart the second distance.

* * * * *